(12) United States Patent
Lu et al.

(10) Patent No.: US 12,041,752 B2
(45) Date of Patent: Jul. 16, 2024

(54) ELECTRONIC DEVICE, HEAT DISSIPATION APPARATUS THEREOF, AND VEHICLE DEVICE

(71) Applicant: Beijing Horizon Robotics Technology Research and Development Co., Ltd., Beijing (CN)

(72) Inventors: Zenghui Lu, Beijing (CN); Shaoxiao Wu, Beijing (CN)

(73) Assignee: Beijing Horizon Robotics Technology Research and Development Co., Ltd., Beijing (CN)

( * ) Notice: Subject to any disclaimer, the term of this patent is extended or adjusted under 35 U.S.C. 154(b) by 340 days.

(21) Appl. No.: 17/239,612

(22) Filed: Apr. 25, 2021

(65) Prior Publication Data

US 2021/0251102 A1    Aug. 12, 2021

Related U.S. Application Data

(63) Continuation of application No. PCT/CN2019/114754, filed on Oct. 31, 2019.

(30) Foreign Application Priority Data

Oct. 31, 2018    (CN) .......................... 201811293030.0

(51) Int. Cl.
H05K 7/20        (2006.01)
(52) U.S. Cl.
CPC ................................ *H05K 7/2039* (2013.01)

(58) Field of Classification Search
CPC .. H05K 7/209; H05K 7/2039; H05K 7/20445; H05K 7/20854; H05K 1/0203;
(Continued)

(56) References Cited

U.S. PATENT DOCUMENTS 4,825,337 A      4/1989  Karpman
5,151,777 A *    9/1992  Akin ................... H01L 23/3735
                                                        428/614
(Continued)

FOREIGN PATENT DOCUMENTS

CN     101056527 A    10/2007
CN     101466247 A     6/2009
(Continued)

OTHER PUBLICATIONS

First Office Action in counterpart Chinese Patent Application No. 201811293030.0, dated Sep. 3, 2019.
(Continued)

*Primary Examiner* — Adam B Dravininkas
(74) *Attorney, Agent, or Firm* — Westbridge IP LLC

(57) ABSTRACT

An electronic device includes: a circuit board including a substrate and at least one first electronic element disposed on one side of the substrate; a first heat dissipation component; and a first heat conduction component including a first heat conduction plate and at least one first heat conduction member disposed on the first heat conduction plate and corresponding to the at least one first electronic element. A material of the first heat conduction component is different from that of the first heat dissipation component, and the first heat conduction component is disposed between the first heat dissipation component and the circuit board.

17 Claims, 4 Drawing Sheets

(58) Field of Classification Search
CPC .............. H05K 3/0061; H05K 7/20254; H01L 2924/01014
See application file for complete search history.

(56) References Cited

U.S. PATENT DOCUMENTS

| | | | |
|---|---|---|---|
| 2006/0057768 A1* | 3/2006 | Nakanishi | H01L 23/3732 438/106 |
| 2009/0279300 A1* | 11/2009 | Okajima | H05K 1/0203 362/249.02 |
| 2010/0053897 A1* | 3/2010 | Kusaka | G06F 1/203 361/707 |
| 2015/0173168 A1* | 6/2015 | Jiang | H02M 3/003 361/720 |
| 2019/0171258 A1* | 6/2019 | Rice | F28D 15/0275 |

FOREIGN PATENT DOCUMENTS

| | | |
|---|---|---|
| CN | 201438801 U | 4/2010 |
| CN | 202979546 U | 6/2013 |
| CN | 203633032 U | 6/2014 |
| CN | 205052048 U | 2/2016 |
| CN | 206237732 U | 6/2017 |
| CN | 107124850 A | 9/2017 |
| CN | 108282408 A | 7/2018 |
| JP | 2015504240 A | 2/2015 |
| JP | 2017135371 A | 8/2017 |
| JP | 2018098515 A | 6/2018 |

OTHER PUBLICATIONS

International Search Report in corresponding PCT Application No. PCT/CN2019/114754, dated Jan. 21, 2020.
Second Office Action in counterpart Chinese Patent Application No. 201811293030.0, dated Apr. 14, 2020.

* cited by examiner

ELECTRONIC DEVICE, HEAT DISSIPATION APPARATUS THEREOF, AND VEHICLE DEVICE

CROSS-REFERENCE TO RELATED APPLICATIONS

The application is a continuation application of International Application No. PCT/CN2019/114754 filed on Oct. 31, 2019, which claims priority of Chinese Patent Application No. 201811293030.0, filed on Oct. 31, 2018. Both applications are incorporated herein by reference in their entireties.

TECHNICAL FIELD

The disclosure relates to the field of electronic technologies, in particular to an electronic device, a heat dissipation apparatus thereof, and a vehicle device.

BACKGROUND

Heat dissipation of an electronic device, especially a vehicle-mounted electronic device such as an Electronic Control Unit (ECU), is a challenging problem.

SUMMARY

The disclosure is provided to solve the technical problems above. Embodiments of the disclosure provide an electronic device, a heat dissipation apparatus thereof, and a vehicle device to improve the reliability and stability of the electronic device.

According to one aspect of the disclosure, the disclosure provides an electronic device, including: a circuit board comprising a substrate and at least one first electronic element disposed on one side of the substrate; a first heat dissipation component; and a first heat conduction component comprising a first heat conduction plate and at least one first heat conduction member disposed on the first heat conduction plate and corresponding to the at least one first electronic element. A material of the first heat conduction component is different from that of the first heat dissipation component, and the first heat conduction component is disposed between the first heat dissipation component and the circuit board.

According to another aspect of the disclosure, the disclosure provides a heat dissipation apparatus for an electronic device, including: a first heat dissipation component; and a first heat conduction component comprising a first heat conduction plate and at least one first heat conduction member disposed on the first heat conduction plate and corresponding to at least one first electronic element on a circuit board of the electronic device. A material of the first heat conduction component is different from that of the first heat dissipation component, and the first heat conduction component is disposed between the first heat dissipation component and the circuit board.

According to still another aspect of the disclosure, the disclosure provides a vehicle device, including the electronic device above.

According to the technical solutions of the embodiments of the present disclosure, overall heat dissipation of an entire circuit board of the electronic device and a high-power-consumption electronic element on the circuit board may be implemented, and multi-point heat dissipation and multi-direction heat dissipation of the high-power-consumption element may also be implemented, thereby improving the reliability and stability of the electronic device. Furthermore, according to the technical solutions of the embodiments of the present disclosure, a good anti-electromagnetic interference performance can be achieved, thereby ensuring a normal operation of the electronic device.

BRIEF DESCRIPTION OF DRAWINGS

These and other purposes, features, and advantages of this disclosure may be more apparent by a more detailed description of the embodiments of this disclosure in combination with drawings. The drawings are used to provide further understanding of the embodiments of this disclosure and form a part of this specification. The drawings are used to explain this disclosure with the embodiments of this disclosure, but not used to limit this disclosure. The same reference numerals usually represent the same part or step.

DETAILED DESCRIPTION OF THE EMBODIMENTS

Figure 1:
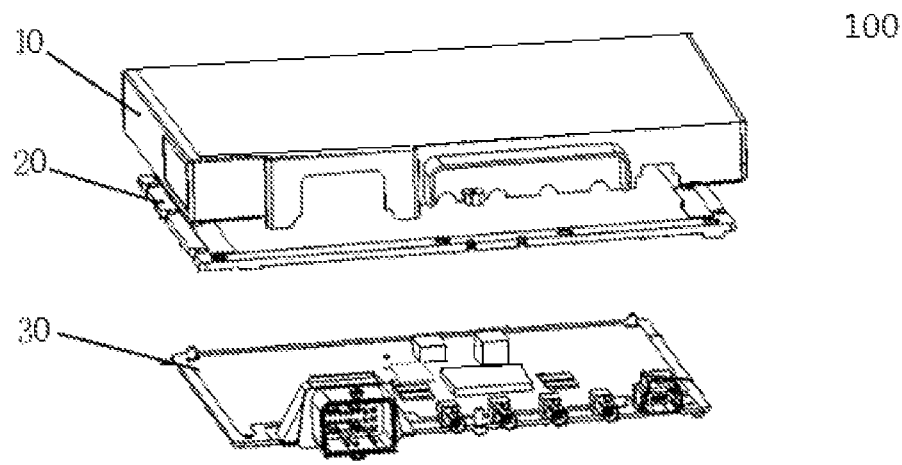
FIG. 1 is a schematic exploded diagram of an electronic device according to an embodiment of this disclosure.

The technical solutions disclosed in the embodiments may be described clearly and completely in combination with the drawings of this disclosure. Apparently, the embodiments described herein are only a part of the embodiments of this disclosure, and not all embodiments. Based on the embodiments of this disclosure, all other embodiments obtained by persons having ordinary skill in the art without creative labor should be included within the protection scope of this disclosure.

Overview

A conventional heat dissipation method and device cannot meet heat dissipation requirements of the electronic device, especially a high-power-consumption device such as an artificial intelligence processor.

Heat dissipation modes for an electronic device are divided into three categories: a heat conduction mode, a radiation mode and a convection mode.

In the automobile field, a power consumption of a common ECU is basically 4-10 watts (W), the current heat dissipation mode is usually the heat conduction mode, and most of automobile ECUs are single-point heat dissipation and single-direction heat dissipation.

At present, a power consumption of an artificial intelligence processor is basically at the magnitude of several tens of watts or over, and the above heat conduction modes already cannot meet heat dissipation requirements of such high-power devices. Thus, many artificial intelligence automobile manufacturers have adopted an air-cooled design model, i.e., an air duct design, which uses high-power fans, but the reliability and stability of which are greatly reduced.

In addition, some artificial intelligence automobile manufacturers use an aluminum housing as a heat conduction medium, but a heat dissipation structure framework of the ECU cannot meet the requirements of high-power consumption, and the stability is still very low, which leads to failure of a normal operation of the electronic device.

To solve the problems of poor reliability and stability of the electronic device such as the ECU, the disclosure provides the technical solutions, overall heat dissipation of an entire electronic device including a circuit board is implemented, and based on this, the multi-point heat dissipation and the multi-direction heat dissipation for high-power elements are added, so as to solve the above problems more effectively.

Specifically speaking, in the disclosure, two materials with different heat conduction coefficient and specific heat capacity are adopted to implement the overall heat dissipation of the circuit board generating heat, i.e., an heat conduction component with fast heat absorption is disposed at a position adjacent to the circuit board to implement the overall heat dissipation of the circuit board, and an heat dissipation component with fast heat release is disposed on one side of the heat conduction component away from the circuit board to release the heat absorbed by the heat conduction component fast, thereby realizing fast and efficient heat dissipation.

After the basic principles of the disclosure have been introduced, various non-limiting embodiments of the disclosure may be described in detail below with reference to the drawings.

Exemplary Device

FIG. 1 is a decomposition schematic diagram of an electronic device according to an exemplary embodiment of this disclosure. As shown in FIG. 1, the electronic device 100 includes a first heat dissipation component 10, a first heat conduction component 20 and a circuit board 30.

Figure 2:
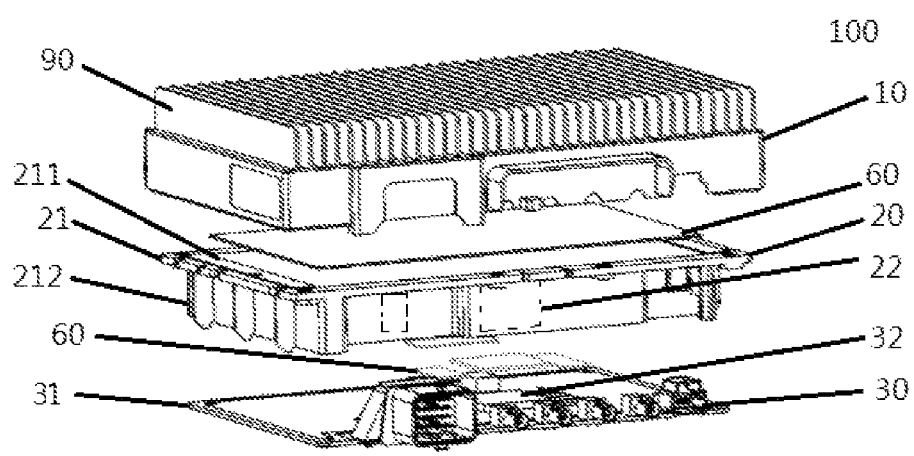
FIG. 2 is a schematic exploded diagram of an electronic device according to another embodiment of this disclosure.

FIG. 2 is a decomposition schematic diagram of an electronic device according to an exemplary embodiment of this disclosure. As shown in FIG. 2, the circuit board 30 includes a substrate 31 and one or more electronic elements 32 disposed on the substrate 31. The electronic elements 32 are all disposed on a same side of the substrate 31, i.e., the electronic elements 32 are arranged on a same surface of the substrate 31. The first heat conduction component 20 includes a first heat conduction plate 21 and one or more first heat conduction members 22 disposed on the first heat conduction plate 21 and corresponding to at least one electronic element 32. Positions of the first heat conduction members 22 are corresponding to those of the electronic elements 32, and one first heat conduction member 22 may be corresponding to multiple electronic elements 32 to implement the heat dissipation of these corresponding electronic elements 32, or one first heat conduction member 22 may be corresponding to one electronic element 32 to implement the heat dissipation of the one electronic element 32. A material of the first heat conduction component 20 is different from that of the first heat dissipation component 10. In an embodiment, a specific heat capacity and a heat conduction coefficient of the first heat conduction component 20 are different from those of the first heat dissipation component 10. The first heat conduction component 20 is disposed between the first heat dissipation component 10 and the circuit board 30. Compared with the specific heat capacity and the heat conduction coefficient of the first heat dissipation component 10, the first heat conduction component 20 has a smaller specific heat capacity and a higher heat conduction coefficient, so the first heat conduction component 20 may absorb the heat fast from the circuit board 30 and transfer the heat to the first heat dissipation component 10, and then the first heat dissipation component 10 may release the heat to an outer space. In this way, the heat conduction component with fast heat absorption and the heat dissipation component with fast heat dissipation are effectively combined to implement the heat dissipation of the circuit board more efficiently.

According to the embodiments of the disclosure, the overall heat dissipation of the entire circuit board of the electronic device 100 and the high-power-consumption electronic elements on the circuit board may be implemented, and the multi-point heat dissipation and multi-direction heat dissipation of the high-power-consumption elements may also be implemented, thereby improving the reliability and stability of the electronic device 100.

As shown in FIG. 2, in an embodiment of the disclosure, the first heat conduction component 20 may be made of a material with a lower specific heat capacity than the first heat dissipation component 10 and a higher heat conduction coefficient than the first heat dissipation component 10, so the first heat conduction component 20 may absorb the heat fast from the electronic elements and transfer the heat to the first heat dissipation component 10.

In an embodiment of the disclosure, the first heat dissipation component 10 may be made of a metal material such as gold, silver, aluminum or copper, etc., and preferably aluminum. Alternatively, it may also be made of a non-metal material with low heat conduction coefficient. The first heat conduction component 20 may be made of a metal material such as gold, silver, aluminum or copper, etc., and preferably copper. Furthermore, the first heat conduction component 20 may be made of red copper. Alternatively, it may also be made of a non-metal material with high heat conduction coefficient, so as to achieve a better heat conduction effect of the heat conduction component.

In an embodiment of the disclosure, a silicon sheet 60 is disposed between the first heat dissipation component 10 and the first heat conduction component 20. Since the silicon sheet 60 has high heat conductivity, the heat conductivity efficiency is increased and a heat resistance between the first heat conduction component 20 and the first heat dissipation component 10 is reduced, so as to further improve the heat conductivity efficiency of the electronic device. A size of the silicon sheet 60 may be the same as or smaller than that of a bottom portion 211 of the first heat conduction component 20. The silicon sheet 60 may be directly disposed on the bottom portion 211 of the first heat conduction component 20 toward the first heat dissipation component 10, or may be bonded to the bottom portion 211 of the first heat conduction component 20 toward the first heat dissipation component 10.

In an embodiment of the disclosure, the first heat conduction plate 21 may be plate-shaped, and further may be flat plate-shaped. When the first heat conduction plate 21 is in contact with the circuit board 30 directly, a contact area between the first heat conduction plate 21 and the circuit board 30 may be increased, and a contact area between the first heat conduction plate 21 and the first heat dissipation component 10 may be increased. The at least one first heat conduction member 22 may be embedded in the first heat conduction plate 21 to form a plane with it. Or the at least one first heat conduction member 22 protrudes from the first heat conduction plate 21 in a direction of the circuit board 30, i.e., a direction away from the first heat dissipation component 10. Or some of the first heat conduction members 22 are embedded in the first heat conduction plate 21 to form a plane with it, and the other first heat conduction members 22 protrude from the first heat conduction plate 21 in the direction of the circuit board 30. When the first heat conduction members 22 are all embedded in the first heat conduction plate 21, a distance between the first heat conduction plate 21 and the circuit board 30 may be reduced, thus reducing an entire volume of the electronic device 100 including the first heat conduction plate 21 and the circuit board.

In an embodiment of the disclosure, the first heat conduction plate 21 may not be plate-shaped, but may be frame-shaped. The first heat conduction plate 21 may include the bottom portion 211 and a side wall 212, and the bottom portion 211 may be plate-shaped, and further may be flat plate-shaped. An area of the bottom portion 211 is less than that of a bottom surface of an inner surface of the first dissipation component 10. In an embodiment, the area of the bottom portion 211 is approximately equal to that of the bottom surface of the inner surface of the first dissipation component 10, so that there is a better contact between the bottom portion 211 and the bottom surface of the inner surface of the first dissipation component 10, thereby transferring the heat absorbed by the first heat conduction component 20 to the first heat dissipation component 10.

The side wall 212 of the first heat conduction plate 21 protrudes from the bottom portion 211 toward the circuit board 30, so that a continuous side portion is formed at an edge of the bottom portion 211 and surrounds the bottom portion 211, so as to surround the circuit board 30 therein. Thus, the first heat conduction component 20 may be better matched with the first dissipation component 10 and more firmly accommodated in the first dissipation component 10. Or the side wall 212 is a discontinuous side portion, i.e., the side wall 212 protrudes from the edge of the bottom portion 211 toward the circuit board 30, so that a loop of a discontinuous side wall is formed; or the side wall 212 protrudes from a part of the edge of the bottom portion 211 toward the circuit board 30, so that an unclosed side wall 212 is formed. Or the side wall 212 protrudes from a position at a certain distance from the edge of the bottom portion 211 toward the circuit board 30, i.e., the side wall 212 is disposed at a certain distance from the edge of the bottom portion 211. The circuit board 30 may be more firmly accommodated in the first heat conduction plate 21 with the side wall 212, and when the side wall 212 is a loop of a side wall, a housing of the electronic device may be used to form a closed space, so as to provide a further electromagnetic shielding for the circuit board 30.

One side of the bottom portion 211 of the first heat conduction plate 21 is connected to the first dissipation component 10 where the side wall 212 is not formed. The bottom portion 211 may be connected to the first dissipation component 10 by fastening screws, or may be bonded to the first dissipation component 10, or may only be contacted with the first dissipation component 10 without forming a fixed connection. When the first heat conduction plate 21 is connected to the first dissipation component 10 by the bottom portion 211, the contact area between the first heat conduction component 20 and the first dissipation component 10 may be increased, so as to increase the heat conduction effect between them.

In an embodiment of the disclosure, the first heat conduction members 22 may be formed integrally with the first heat conduction plate 21, or may be connected to the first heat conduction plate 21, for example, by screw connecting, bonding or welding, etc. A material of the first heat conduction plate 21 may be the same as or different from that of the first heat conduction members 22. The at least one first heat conduction member 22 may be a cuboid, a cube, a cylinder or a cone, etc., such as a circular cylinder or a truncated cone. Furthermore, the first heat conduction members 22 may be disposed corresponding to the electronic elements 32, and the first heat conduction members 22 protrude from the first heat conduction plate 21 toward the electronic elements 32 to contact with the electronic elements. When a size of one electronic element is large, multiple first heat conduction members 22 may be in contact with the one electronic element 32 at the same time. Or when multiple electronic elements 32 are disposed adjacent to each other, the multiple first heat conduction members 22 may be misplaced with the multiple electronic elements 32, and each of the first heat conduction members is in contact with two adjacent electronic elements 32.

In an embodiment of the disclosure, the first heat conduction members 22 and the electronic elements 32 are disposed in the same way as in the above embodiments, but the first heat conduction members 22 protrude from the first heat conduction plate 21 toward the electronic elements 32 without contact with the electronic elements. The silicon sheet 60 is disposed between the first heat conduction member 22 and the electronic element 32, so as to reduce the heat resistance between the first heat conduction member 22 and the electronic element 32 and further improve the heat conductivity efficiency. The silicon sheet 60 may be disposed on the first heat conduction member 22 or the electronic element 32. The silicon sheet 60 may be directly disposed on the first heat conduction member 22 or the electronic element 32, or may be bonded to the first heat conduction member 22 or the electronic element 32.

Figure 3:
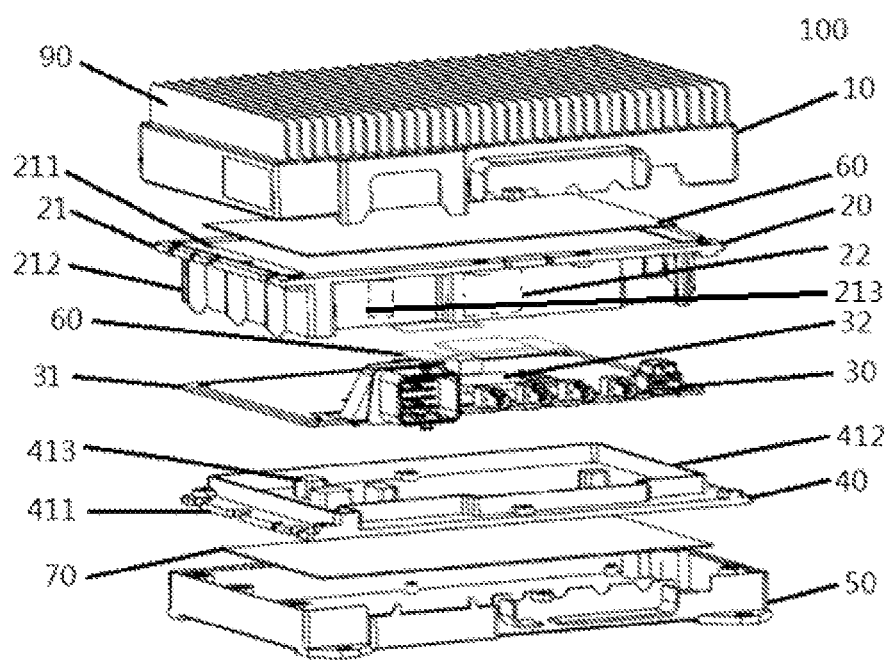
FIG. 3 is a schematic exploded diagram of an electronic device according to another embodiment of this disclosure.

In an embodiment of the disclosure, as shown in FIG. 3, a locating member 213 is disposed on one side of the first heat conduction component 20 toward the circuit board 30 for aligning the first heat conduction members 22 with corresponding electronic elements 32 respectively. The number of the locating member 213 may be one or more, and disposed on the first heat conduction plate, and further disposed on one side of the bottom portion 211 toward the circuit board 30. The one or more locating members 213 may be disposed at a corner of the bottom portion 211 or disposed at a position of the bottom portion 211 corresponding to the absence of the electronic element 32.

FIG. 3 is a decomposition schematic diagram of an electronic device according to an exemplary embodiment of this disclosure.

As shown in FIG. 3, in the embodiment of the disclosure, two heat conduction components may be disposed, i.e., a first heat conduction component and a second heat conduction component. The first heat conduction component 20 shown in FIG. 3 is disposed above the circuit board 30, the second conduction component 40 is disposed under the circuit board 30, and the circuit board 30 are clamped between the first heat conduction component 20 and the second conduction component 40. A material of the second heat conduction component 40 may be the same as that of the first heat conduction component 20, which may be made of a metal material such as gold, silver, aluminum or copper, etc., preferably copper, and more preferably red copper.

A structure of the second heat conduction component 40 may be the same as that of the first heat conduction component 20, which includes a second heat conduction plate 41 and one or more second heat conduction members (not shown). The second heat conduction plate 41 may be plate-shaped, and further may be flat plate-shaped. The second heat conduction members may be embedded in the second heat conduction plate 41 to form a plane with it. Or the second heat conduction members protrude from the second heat conduction plate 41 in a direction of the circuit board 30. Or some of the second heat conduction members are embedded in the second heat conduction plate 41 to form a plane with it, and the other second heat conduction members protrude from the second heat conduction plate 41 in the direction of the circuit board 30. In another embodiment, the second heat conduction plate 41 may be frame-shaped. The second heat conduction plate 41 may include a bottom portion 411 and a side wall 412, and the bottom portion 411 may be plate-shaped, and further may be flat plate-shaped. An area of the bottom portion 411 is less than that of a bottom surface of an inner surface of a second heat dissipation component 50, and further approximately equal to that of the bottom surface of the inner surface of the second heat dissipation component 50. The side wall 412 of the second heat conduction plate 41 protrudes from the bottom portion 411 toward the circuit board 30, so that a continuous side portion is formed at an edge of the bottom portion 411 and surrounds the bottom portion 411, so as to surround the circuit board 30 therein. Or the side wall 412 is a discontinuous side portion, i.e., the side wall 412 protrudes from the edge of the bottom portion 411 toward the circuit board 30, so that a loop of a discontinuous side wall is formed; or the side wall 412 protrudes from a part of the edge of the bottom portion 411 toward the circuit board 30, so that an unclosed side wall 412 is formed. Or the side wall 412 protrudes from a position at a certain distance from the edge of the bottom portion 411 toward the circuit board 30, i.e., the side wall 412 is disposed at a certain distance from the edge of the bottom portion 411.

The electronic elements 32 on the circuit board 30 may be electronic elements toward the first conduction component 20, and in this case, positions of the second heat conduction members of the second heat conduction component 40 may be corresponding to those of the electronic elements 32. Or the electronic elements 32 may also include electronic elements (not shown) disposed on the circuit board 30 toward the second heat conduction component 40, and in this case, the positions of the second heat conduction members may be corresponding to those of the electronic elements toward the second heat conduction component 40.

In an embodiment of the disclosure, when the first heat conduction component 20 and the second heat conduction component 40 are disposed simultaneously, the first heat conduction component 20 and the second heat conduction component 40 may form a closed space, in which the circuit board 30 is surrounded, and terminals on the circuit board 30 and connected with the outside are placed outside of the closed space. When the first heat conduction component 20 and the second heat conduction component 40 are combined with each other, the side wall 212 of the first heat conduction component 20 may be aligned with the side wall 412 of the second heat conduction component 40, thus forming a closed space. In another embodiment, the side wall 412 of the second heat conduction component 40 is accommodated in the side wall 212 of the first heat conduction component 20, and an end of the side wall 212 contacts with the bottom portion 411 of the second heat conduction component 40, thus forming a closed space. In still another embodiment, the side wall 212 of the first heat conduction component 20 is accommodated in the side wall 412 of the second heat conduction component 40, and an end of the side wall 412 contacts with the first heat conduction plate 21 of the first heat conduction component 20, thus forming a closed space. The side wall 212 of the first heat conduction component 20 and the side wall 412 of the second heat conduction component 40 may form concaved portions or protruding portions with different shapes and sizes to accommodate one or more terminals on the circuit board 30 and connected with the outside, and a shape and size of each of the concaved portions or protruding portions is matched with those of the terminals to be accommodated, thus forming a structure placing the terminals outside of the closed space. The concaved portions or protruding portions may increase a heat dissipation area and strength of the side wall 212, thereby increasing a heat dissipation area of the whole first heat conduction component 20 and improving the stability of the heat conduction component.

An anti-electromagnetic interference to the circuit board 30 may also be formed through the closed space formed by the first heat conduction component 20 and the second heat conduction component 40, i.e., in addition to that a housing of the electronic device may realize the anti-electromagnetic interference, the closed space formed by the first heat conduction component 20 and the second heat conduction component 40 may further realize the anti-electromagnetic interference.

When the electronic device is applied to a motor vehicle, especially in a vehicle with an autonomous driving image acquisition system, the heat conduction component may not only provide an excellent heat dissipation effect, but also provide a good anti-electromagnetic interference performance, so as to ensure the normal operation of the autonomous driving image acquisition system in the required vehicle.

In an embodiment of the disclosure, one or more locating members 413 may be disposed on the second heat conduction component 40, and the locating members 413 protrude from the second heat conduction component 40 toward the circuit board 30 for aligning the second heat conduction member with the electronic element 32. The locating members 413 may be disposed on the second heat conduction plate 41, and further disposed on one side of the bottom portion 411 toward the circuit board 30. The locating members 413 may be disposed at a corner of the bottom portion 411 or disposed at a position of the bottom portion 411 corresponding to the absence of the electronic element.

In an embodiment of the disclosure, two heat dissipation components may be disposed, i.e., a first heat dissipation component 10 and a second heat dissipation component 50. The second heat dissipation component 50 is configured to cooperate with the first heat dissipation component 10 to accommodate the first heat conduction component 20 and the circuit board 30 therein, or cooperate with the first heat dissipation component 10 to accommodate the first heat conduction component 20, the circuit board 30 and the second heat conduction component 40 therein. A structure of the second heat dissipation component 50 may be the same as that of the first heat dissipation component 10, and a material of the second heat dissipation component 50 may be the same as that of the first heat dissipation component 10.

In an embodiment of the disclosure, a silicon sheet 70 is disposed between the second heat conduction component 40 and the second heat dissipation component 50. The silicon sheet 70 may be disposed in the same way as the silicon sheet 60. A material and size of the silicon sheet 70 may be the same as those of the silicon sheet 60.

In an embodiment of the disclosure, the first heat conduction component 20 and a cover (not shown) may form a closed space, in which the circuit board 30 is surrounded, and the terminals on the circuit board 30 and connected with the outside are placed outside of the closed space. A material of the cover may be a metal material with high heat conductivity such as gold, silver, copper or aluminum, etc., or a non-metal material with high heat conductivity. A structure of the cover may be plate-shaped, plate-shaped with a side wall or any structure that may form the closed space with the first heat conduction component 20.

In an embodiment of the disclosure, the electronic device may be an autonomous driving image acquisition system, and the electronic element may include an artificial intelligence processor chip.

In another embodiment of the disclosure, the first heat dissipation component 10 is disposed outside of the electronic device 100, which may form a housing of the electronic device 100, so as to accommodate the first heat conduction component 20 and the circuit board 30 therein. A shape of the first heat dissipation component 10 is not limited to a rough cuboid shown in FIG. 1, for example, the shape may be a multi-sided body, a cylinder, a cone or a truncated cone, as long as the first heat conduction component 20 and the circuit board 30 can be accommodated in the first heat dissipation component 10.

In another embodiment of the disclosure, the circuit board 30 may be a Printed Circuit Board (PCB) of the electronic device or a Printed Circuit Board Assembly (PCBA). The circuit board 30 may include the substrate 31 and one or more electronic elements 32 to realize various functions of the electronic device, such as image acquisition, etc. The electronic element may be a chip, a memory, a power supply, etc.

In another embodiment of the disclosure, multiple fins 90 may be disposed on one side of the first heat dissipation component 10 and/or the second heat dissipation component 50 toward an outside space to increase a heat dissipation surface area of the heat dissipation apparatus, thus achieving a more efficient heat dissipation effect. A material of the fins 90 may be the same as or different from that of the first heat dissipation component 10 and/or the second heat dissipation component 50.

In another embodiment of the disclosure, the first heat conduction members 22 of the first heat conduction component 20 may penetrate the first heat conduction plate 21, one end of which is in contact with an inner surface of the first heat dissipation component 10, and the other end of which is in contact with the electronic elements.

In another embodiment of the disclosure, a limiting groove may be disposed on a side surface of the first heat conduction plate 21 toward the heat dissipation component 10 for better positioning the silicone sheet 60.

Figure 4:
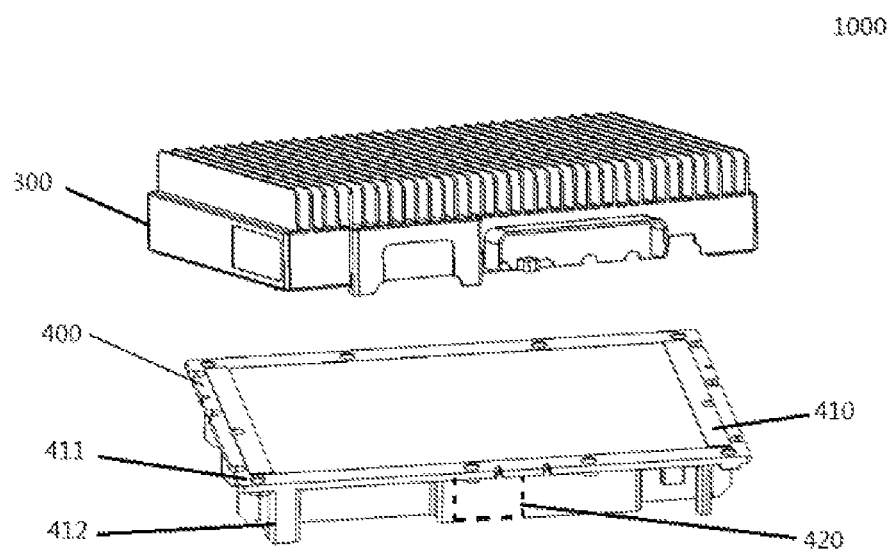
FIG. 4 is a schematic exploded diagram of a heat dissipation apparatus according to an embodiment of this disclosure.
Figure 5:
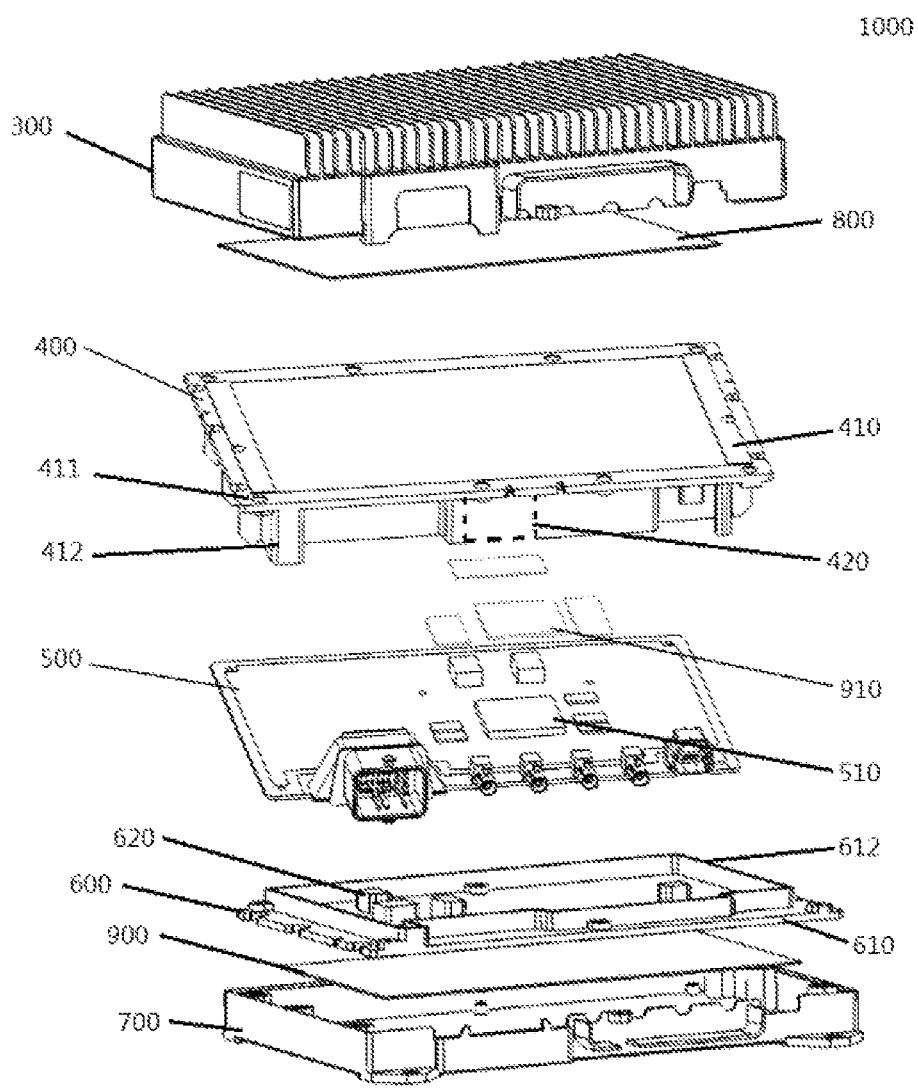
FIG. 5 is a schematic exploded diagram of a heat dissipation apparatus according to another embodiment of this disclosure.

FIG. 4 is a decomposition schematic diagram of a heat dissipation apparatus according to an exemplary embodiment of this disclosure, and FIG. 5 is a decomposition schematic diagram of a heat dissipation apparatus according to another exemplary embodiment of this disclosure. As shown in FIG. 4 and FIG. 5, the heat dissipation apparatus 1000 is applied to the electronic device 500, and the electronic device 500 may include an image acquisition system, etc., or any electronic device including an artificial intelligence processor. The heat dissipation apparatus 1000 may accommodate a chip of the artificial intelligence processor therein, and may accommodate the electronic elements of the electronic device that may generate high power consumption therein. The electronic elements with high power consumption may generate power consumption of tens of watts or more. Or in order to pursue a better heat dissipation effect, the electronic device 500 may also be a traditional electronic control unit or a low-power electronic device generating a power consumption of more than ten watts.

The heat dissipation apparatus 1000 may include a first heat dissipation component 300 and a first heat conduction component 400 for implementing heat dissipation of the electronic device 500, more specifically, implementing the heat dissipation of electronic elements 510 of the electronic device 500. The first heat conduction component 400 includes a first heat conduction plate 410 and one or more first heat conduction members 420 disposed on the first heat conduction plate 410. The first heat conduction members 420 may be formed integrally with the first heat conduction plate 410 or connected to the first heat conduction plate 410, for example, by bonding, fasten connecting or welding, etc. A material of the first heat conduction members 420 is different from that of the first heat dissipation component 300, for example, a specific heat capacity and a heat conduction coefficient of the first heat conduction component 400 are different from those of the first heat dissipation component 300. The first heat conduction component 400 may be disposed between the first heat dissipation component 300 and the electronic elements 510, so that the first heat conduction component 400 may absorb heat fast from the electronic elements 510 and transfer the heat to the first heat dissipation component 300, and then the first heat dissipation component 300 may release the heat to an outer space. In this way, the first heat conduction component absorbs the heat fast, and the first heat dissipation component releases the heat fast, so as to implement the heat dissipation of the circuit board 500 more efficiently.

In an embodiment of the disclosure, the first heat conduction plate 410 may be plate-shaped, and further may be flat plate-shaped. The first heat conduction members 420 may be embedded in the first heat conduction plate 410 to form a plane with it. Or the first heat conduction members 420 protrude from the first heat conduction plate 410 in a direction of the circuit board 500, i.e., a direction away from the first heat dissipation component 300.

In an embodiment of the disclosure, the first heat conduction plate 410 may be frame-shaped. The first heat conduction plate 410 may include a bottom portion 411 and a side wall 412, and the bottom portion 411 may be plate-shaped. The side wall 412 may protrude from the bottom portion 411 toward the circuit board 500, so that a continuous side portion is formed at an edge of the bottom portion 411 and may surround the bottom portion 411, so as to surround the circuit board 500 therein. Thus, the first heat conduction component 400 may be better matched with the first dissipation component 300 and may be more firmly accommodated in the first dissipation component 300. Or the side wall 412 is a discontinuous side portion or may be formed at only a part of the edge of the bottom portion 411. A distance between the side wall 412 and the edge of the bottom portion 411 is not limited in the disclosure.

One side of the bottom portion 411 of the first heat conduction plate 410 is connected to the first heat dissipation component 300 where the side wall 412 is not formed, for example, by fasten screw connecting or bonding, etc.

In an embodiment of the disclosure, the first heat conduction members 420 may be formed integrally with the first heat conduction plate 410 or connected to the first heat conduction plate 410, for example, by screw connecting, bonding or welding, etc. The first heat conduction members 420 may be a cuboid, a cube, a cylinder, a cone or a truncated cone, etc. The first heat conduction members 420 may be disposed corresponding to the electronic elements and protrude from the first heat conduction plate 410 toward the electronic elements to contact with the electronic elements. Or the first heat conduction members 420 may be not in contact with the electronic elements. A silicon sheet is disposed between the first heat conduction members 420 and the electronic elements 510, so as to reduce a heat resistance between the first heat conduction members 420 and the electronic elements and further improve the heat conductivity efficiency.

In an embodiment of the disclosure, a silicon sheet may be disposed on the first heat conduction members 420 or the electronic elements 510. A silicon sheet 800 is disposed between the first heat conduction component 400 and the first heat dissipation component 300, so as to further increase the heat dissipation efficiency of the heat dissipation apparatus 1000.

In an embodiment of the disclosure, a second heat conduction component 600 is also disposed, including a second heat conduction plate 610 and a second heat conduction member 620. When the first heat conduction component 400 and the second heat conduction component 600 are disposed simultaneously, the first heat conduction component 400 and the second heat conduction component 600 may form a closed space, in which the circuit board 500 is surrounded, and terminals on the circuit board 500 and connected with the outside are placed outside of the closed space. Specifically speaking, the side wall 412 of the first heat conduction component 400 may be aligned with a side wall 612 of the second heat conduction component 600, thus forming a closed space. The side wall 412 of the first heat conduction component 400 and the side wall 612 of the second heat conduction component 600 may form concaved portions or protruding portions with different shapes and sizes to accommodate the circuit board 500 and one or more terminals connected with the outside. A shape and size of each of the concaved portions or protruding portions is matched with those of the terminals to be accommodated, thus forming a structure placing the terminals outside of the closed space. The concaved portions or protruding portions may increase a heat dissipation area and strength of the side wall 412, thereby increasing a heat dissipation area of the whole first heat conduction component 400 and improving the stability of the first heat conduction component.

An anti-electromagnetic interference of the circuit board 500 may also be formed through the closed space formed by the first heat conduction component 400 and the second heat conduction component 600. I.e., in addition to the case of a housing of the electronic device may realize the anti-electromagnetic interference, the closed space formed by the first heat conduction component 400 and the second heat conduction component 600 may further realize the anti-electromagnetic interference.

The heat dissipation apparatus 1000 may also include a second heat dissipation component 700, which may be approximately the same as the first heat dissipation component 300. A silicon sheet 900 is disposed between the second heat dissipation component 700 and the second heat conduction component 600, so as to further increase the heat dissipation efficiency of the heat dissipation apparatus.

It can be seen from the above embodiments, the first heat conduction component 400, the second heat conduction component 600, the first heat dissipation component 300 and the second heat dissipation component 700 contact in a large area, so the first heat conduction component 400 and the second heat conduction component 600 may transfer heat fast to the first heat dissipation component 300 and the second heat dissipation component 700 respectively, and then the first heat dissipation component 300 and the second heat dissipation component 700 may release the heat to the outside, so as to overcome drawback of the heat dissipation component with low heat conductivity coefficient and high specific heat capacity and realize more fast and efficient heat dissipation, so that the electronic device requiring the heat dissipation can run more stably.

When the heat dissipation apparatus including a heat conduction mechanism and a heat dissipation mechanism is applied to the electronic device and the electronic device is applied to a motor vehicle, especially applied to a vehicle with an autonomous driving image acquisition system, the heat dissipation apparatus may ensure the high-power electronic device up to tens of watts operate normally and basically may not be affected by heat. At the same time, the heat dissipation apparatus may have a good anti-electromagnetic interference performance to ensure the autonomous driving image acquisition system in the required vehicle operate normally.

The above electronic device and the heat dissipation apparatus in the disclosure may be applied to the vehicle device, which may include a miniature vehicle, a small vehicle, a medium vehicle or a large vehicle, may be applied to a passenger vehicle or a bus, and may also be applied to a manual vehicle or an automatic vehicle.

Furthermore, the above electronic device and the heat dissipation apparatus in the disclosure may be applied to an autonomous driving vehicle, especially an autonomous driving vehicle with an image acquisition system.

Referring back to FIG. 3, illustrating an electronic device according to another exemplary embodiment of this disclosure. Compared with the electronic device shown in FIG. 1, the electronic device shown in FIG. 3 has a more complete heat dissipation structure, a more efficient heat dissipation performance and an anti-electromagnetic interference at the same time. The same reference numeral in FIG. 3 and FIG. 1 represents the same part.

As shown in FIG. 3, the electronic device 100 includes the first heat dissipation component 10, the first heat conduction component 20, the circuit board 30, the second heat conduction component 40, the second heat dissipation component 50, the silicon sheet 60 and the silicon sheet 70.

The first heat dissipation component 10 and the second heat dissipation component 50 form a housing of the electronic device 100, so as to accommodate the first heat conduction component 20 and the circuit board 30 therein. Multiple fins may be disposed on a surface of the first heat dissipation component 10 and the second heat dissipation component 50 toward an outer space to increase a heat dissipation surface area of the heat dissipation apparatus, so as to achieve a more effective heat dissipation effect.

The first heat conduction component 20 includes the first heat conduction plate 21 and the at least one first heat conduction member 22 disposed on the first heat conduction plate 21. The positions of the first heat conduction members 22 are corresponding to those of the electronic elements 32. The specific heat capacity and heat conduction coefficient of the first heat conduction component 20 is different from those of the first heat dissipation component 10, for example, the first heat conduction member 20 may be made of a material with a smaller specific heat capacity and a higher heat conduction coefficient than those of the first heat dissipation component 10. The first heat dissipation component 10 may be made of a metal material such as gold, silver, aluminum or copper, etc., and preferably aluminum. Alternatively, it may also be made of a non-metal material with low heat conduction coefficient. The first heat conduction component 20 may be made of a metal material such as gold, silver, aluminum or copper, etc., preferably copper, and more preferably red copper. Alternatively, it may also be made of a non-metal material with high heat conduction coefficient.

The first heat conduction plate 21 may be frame-shaped, i.e., the first heat conduction plate 21 may include the bottom portion 211 and the side wall 212, and the bottom portion 211 may be plate-shaped. The area of the bottom portion 211 is approximately equal to that of the bottom surface of the inner surface of the first heat dissipation component 10. The side wall 212 of the first heat conduction plate 21 may protrude from the bottom portion 211 toward the circuit board 30 and may surround the bottom portion 211, so that a continuous side portion is formed at the edge of the bottom portion 211, so as to surround the circuit board 30 therein. Thus, the first heat conduction component 20 may be better matched with the first dissipation component 10 and may be more firmly accommodated in the first dissipation component 10.

The first heat conduction member 22 may be a cuboid and disposed at the position corresponding to the electronic element and protrudes from the first heat conduction plate 21 toward the electronic element to contact with the electronic element.

The circuit board 30 includes the substrate 31 and the multiple electronic elements 32 disposed on a same side of the substrate 31.

The structure of the second heat conduction component 40 may be the same as that of the first heat conduction component 20, including the heat conduction plate 41 and one or more heat conduction members (not shown). The heat conduction plate 41 may be frame-shaped, i.e., the heat conduction plate 41 may include the bottom portion 411 and the side wall 412, and the bottom portion 411 may be plate-shaped. The area of the bottom portion 411 is approximately equal to that of the bottom surface of the inner surface of the first heat dissipation component 10. The side wall 412 of the heat conduction plate 41 may protrude from the bottom portion 411 toward the circuit board 30 and may surround the bottom portion 411, so that a continuous side portion is formed at the edge of the bottom portion 411, so as to surround the circuit board 30 therein.

The second heat conduction component 40 and the first heat conduction component 20 may form a closed space, in which the circuit board 30 is surrounded, and the terminals on the circuit board 30 and connected with the outside are placed outside of the closed space. When the first heat conduction component 20 and the second heat conduction component 40 are combined with each other, the side wall 212 of the first heat conduction component 20 may be aligned with the side wall 412 of the second heat conduction component 40, thus forming a closed space to further realize the anti-electromagnetic interference.

The silicon sheet 60 is disposed between the first heat dissipation component 10 and the first heat conduction component 20. Since the silicon sheet 60 has high heat conductivity, the heat conductivity efficiency is increased, and the heat resistance between the first heat conduction component and the first heat dissipation component is reduced, so as to further improve the heat conductivity efficiency. The size of the silicon sheet 60 may be the same as or smaller than that of the bottom portion 211 of the first heat conduction plate 21. The silicon sheet 60 may be directly disposed on the bottom portion 211 of the first heat conduction component 20 toward the first heat dissipation component 10 or may be bonded to the bottom portion 211.

The silicon sheet 60 may be also disposed between the first heat conduction members 22 and the electronic elements 32, thus reducing the heat resistance between the first heat conduction members 22 and the electronic elements, so as to further improve the heat conductivity efficiency.

The side wall 212 of the first heat conduction plate 21 and the side wall 412 of the second heat conduction plate 41 may form the concaved portions or the protruding portions with different shapes and sizes, so as to accommodate one or more terminals on the circuit board 30 and connected with the outside. The shape and size of each of the concaved portions or protruding portions are matched with those of the terminal to be accommodated, thus forming a structure placing the terminals outside of the closed space. The concaved portions or protruding portions may increase the heat dissipation area and strength of the side wall 212, thereby increasing the heat dissipation area of the whole first heat conduction component 20 and improving the stability of the first heat conduction component.

Multiple locating members are disposed on one side portion of the first heat conduction component 20 and the second heat conduction component 40 toward the circuit board 30 respectively for aligning the first heat conduction members 22 or the second heat conduction members with the electronic elements respectively. The locating members 213 may be disposed at the position of the bottom portion 211 or the bottom portion 411 corresponding to the absence of the electronic elements 32.

Exemplary Method

Figure 6:
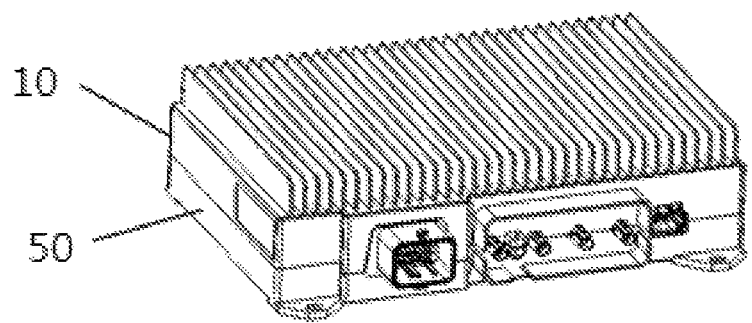
FIG. 6 is a schematic diagram of an electronic device assembled according to an embodiment of this disclosure.

An installation process of the electronic device 100 may be described now with reference to FIG. 3 and FIG. 6.

Step 1, placing the silicon sheet 60 on one side surface of the first heat conduction plate 21 toward the first heat dissipation component 10. In order to install the silicon sheet 60 more stable, an auxiliary tool (not shown) may be used to roll it to ensure a surface of the silicon sheet 60 more smooth, so that there is no bubbles or other sundries between the silicon sheet 60 and the first heat conduction plate 21 of the first heat conduction component 20. The auxiliary tool may be an electric wood stick, or other tools familiar to persons having ordinary skill in the art that may set up the silicon sheet.

Step 2, fastening the first heat conduction component 20 with the silicon sheet 60 to the first heat dissipation component 10 by using fastening screws (not shown). To make the electronic device 100 more stability and reduce shaking of the electronic device 100, the fastening screws may pass through washers (not shown) and then be fastened to the first heat dissipation component 10. The washer may be a spring washer or a flat washer, and the fastening screws pass through the spring washer and the flat washer in turn.

Step 3, placing the silicon sheet 70 on a side surface of the second heat conduction plate 41 of the second heat conduction component 40 toward the second heat dissipation component 50. In order to install the silicon sheet 70 more stable, an auxiliary tool may be used to roll it to ensure a surface of the silicon sheet 70 more smooth, so that there is no bubbles or other sundries between the silicon sheet 70 and the second heat conduction plate 41 of the second heat conduction component 40. The auxiliary tool may be an electric wood stick, or other tools familiar to persons having ordinary skill in the art that may set up the silicon sheet.

Step 4, fastening the second heat conduction component 40 with the silicon sheet 70 to the second heat dissipation component 50 by using fastening screws (not shown). To make the electronic device 100 more stability and reduce shaking of the electronic device 100, the fastening screws may pass through the washers (not shown) and then be fastened to the second heat dissipation component 50. The washer may be a spring washer or a flat washer, and the fastening screws pass through the spring washer and the flat washer in turn.

Step 5, placing the silicon sheet 60 on the electronic elements of the circuit board 30 respectively. Furthermore, the size of the silicon sheet 60 is the same as or slightly greater than that of the corresponding electronic element 32, so as to implement better heat dissipation. In order to better fix the silicon sheet 60 and the electronic element 32, the silicon sheet 60 may be pasted onto the corresponding electronic element 32.

Step 6, fastening the circuit board 30 with the silicon sheet 60 to the first heat dissipation component 10 completed in the step 2 by fastening screws. To make the electronic device 100 more stability and reduce shaking of the electronic device 100, the fastening screws may pass through washers and the circuit board 30 and then be fastened to the first heat dissipation component 10. The washer may be a spring washer or a flat washer, and the fastening screws pass through the spring washer and the flat washer in turn.

Step 7, aligning the first heat dissipation component 10 completed in the step 6 with the second heat dissipation component 50 completed in the step 4. The main method is to align fastening screw holes (not shown) of the first heat dissipation component 10 with fastening screw holes (not shown) of the second heat dissipation component 50 and use the fastening screws to complete the fastening assembly. To make the electronic device 100 more stability and reduce shaking of the electronic device 100, the fastening screws may pass through the washers and the first heat dissipation component 10 and then be fastened to the second heat dissipation component 50. The washer may be a spring washer or a flat washer, and the fastening screws pass through the spring washer and the flat washer in turn.

In each of the above steps of the fastening process, there is no limit to the number of the fastening screws, as long as a stable connection between the two components may be achieved. For example, the number of the fastening screws may be four, six or eight. Corresponding to the number of the fastening screws, there is no limit to the number of the fastening screw holes on the circuit board 30, the first heat dissipation component 10, the first heat conduction component 20, the second heat conduction component 40 and the second heat dissipation component 50, as long as the number is corresponding to that of the fastening screws.

In the above installation process, a step of pasting a label (not shown) on the circuit board 30 may also be added, for example, after the silicon sheet 60 is pasted on the circuit board 30, the label may be pasted at a corner of the circuit board 30. There is no limit to the position that the label is pasted, as long as it is easy to find and install.

After the assembly of the first heat dissipation component 10 is completed, a label (not shown) may be pasted outside of the first heat dissipation component 10. There is no limit to the position that the label of the first heat dissipation component 10 is pasted, as long as it is easy to find and install.

When the circuit board 30 is assembled with the first heat dissipation component 10, the circuit board 30 and the first heat dissipation component 10 with the same label may be fastened together.

Similarly, after the assembly of the second heat dissipation component 50 is completed, a label (not shown) may be pasted outside of the second heat dissipation component 50. There is no limit to the position that the label of the second heat dissipation component 50 is pasted, as long as it is easy to find and install.

Finally, when the first heat dissipation component 10 is assembled with the second heat dissipation component 50, the heat dissipation components with the same label may be fastened together, so that the assembly process of the electronic device 100 may be completed more clearly, and the assembled electronic device 100 is shown in FIG. 6.

The basic principles of the disclosure are described above in combination with the specific embodiments. However, it should be noted that the advantages, benefits and effects mentioned in the disclosure are only exemplary and not limitations, and these advantages, benefits and effects should not be considered necessary for each embodiment of the disclosure. In addition, the details disclosed above are only for the purposes of example and easy understanding, but not limitations, and the above details do not limit that the disclosure should be implemented by the specific details disclosed above.

The block diagrams of components, apparatuses, devices and systems in this disclosure are only for illustrative examples and are not intended to require or imply that they must be connected, disposed or configured in the way shown in the block diagrams. It may be appreciated by persons having ordinary skill in the art that these components, apparatuses, devices and systems may be connected, disposed, and configured in any way. Words such as "include", "comprise", "with", etc., are inclusive, meaning "including but not limited to", and may be used interchangeably with them. Words such as "or" and "and" used here refer to the word "and/or" and may be used interchangeably with them, unless otherwise explicitly indicated in the context. The word "such as" used here refers to the phrase "such as, but not limited to" and may be used interchangeably with it.

It should also be noted that, the components or steps in the apparatuses, devices and methods disclosed herein may be decomposed and/or recombined. Such decomposition and/or recombination shall be regarded as equivalent solutions to the disclosure.

The above descriptions of aspects of the disclosure are provided to enable any person having ordinary skill in the art to make or use the disclosure. The various modifications to these aspects are obvious to persons having ordinary skill in the art, and the general principles defined herein may be applied to other aspects without deviating from the scope of the disclosure. Therefore, the disclosure is not intended to be limited to the aspects shown herein, but in accordance with the widest scope consistent with the principles and novel features disclosed herein.

The above descriptions have been provided for purposes of illustration and descriptions. Furthermore, the descriptions are not intended to limit the embodiments of the disclosure to the forms disclosed herein. Although a number of exemplary aspects and embodiments have been discussed above, some variations, modifications, changes, additions and sub-combinations should be recognized by persons having ordinary skill in the art.

What is claimed is:
1. An electronic device, comprising:
a circuit board comprising a substrate and at least one first electronic element disposed on one side of the substrate;
a first heat dissipation component; and
a first heat conduction component comprising a first heat conduction plate and at least one first heat conduction member disposed on the first heat conduction plate and corresponding to the at least one first electronic element, wherein a material of the first heat conduction component is different from that of the first heat dissipation component, the first heat conduction component is disposed between the first heat dissipation component and the circuit board, and the first heat conduction component is located on a side, away from the substrate, of the at least one first electronic element;

the electronic device further comprises: a second heat conduction component, the second heat conduction component, relative to the first heat conduction component, is disposed on one side of the substrate away from the first heat conduction component, the circuit board further comprises at least one second electronic element disposed on the side of the substrate away from the first heat conduction component, and the second heat conduction component comprises a second heat conduction plate and at least one second heat conduction member disposed on the second heat conduction plate and corresponding to the at least one second electronic element, and the electronic device further comprises: a second heat dissipation component, and the first heat conduction component and the second heat conduction component are surrounded by the first heat dissipation component and the second heat dissipation component.

2. The electronic device according to claim 1, wherein a material of the first heat conduction component is copper, and a material of the first heat dissipation component is aluminum.

3. The electronic device according to claim 1, wherein a silicon sheet is disposed between the first heat conduction component and the first heat dissipation component.

4. The electronic device according to claim 1, wherein the at least one first heat conduction member is protruded from the first heat conduction plate toward the at least one first electronic element respectively.

5. The electronic device according to claim 1, wherein the first heat conduction plate comprises a bottom portion and a side wall, and is connected to the first heat dissipation component through the bottom portion.

6. The electronic device according to claim 1, wherein the at least one first heat conduction member is in contact with the at least one first electronic element respectively.

7. The electronic device according to claim 1, wherein a silicon sheet is disposed between each of the at least one first heat conduction member and a corresponding first electronic element.

8. The electronic device according to claim 1, wherein at least one first locating member is disposed on one side of the first heat conduction component toward the circuit board for aligning the at least one first heat conduction member with the at least one first electronic element respectively.

9. The electronic device according to claim 1, wherein the first heat conduction component and the second heat conduction component form a closed space, and at least one terminal on the circuit board and connected with the outside is disposed outside of the closed space.

10. The electronic device according to claim 1, wherein at least one second locating member is disposed on one side of the second heat conduction component toward the circuit board for aligning the at least one second heat conduction member with the at least one second electronic element respectively.

11. The electronic device according to claim 1, wherein a silicon sheet is disposed between the second heat conduction component and the second heat dissipation component.

12. The electronic device according to claim 1, further comprising:

a cover, wherein the first heat conduction component and the cover form a closed space to accommodate the circuit board, and a terminal on the circuit board and connected with the outside is disposed outside of the closed space.

13. The electronic device according to claim 1, further comprising:

a second heat dissipation component, wherein the first heat conduction component is surrounded by the first heat dissipation component and the second heat dissipation component.

14. The electronic device according to claim 1, wherein the electronic device is an autonomous driving image acquisition system, and the at least one first electronic element comprises an artificial intelligence processor chip.

15. The electronic device according to claim 1, wherein the first heat conduction component has a specific heat capacity lower than that of the first heat dissipation component and a heat conduction coefficient higher than that of the first heat dissipation component.

16. A heat dissipation apparatus for an electronic device, comprising:

a first heat dissipation component; and a first heat conduction component comprising a first heat conduction plate and at least one first heat conduction member disposed on the first heat conduction plate and corresponding to at least one first electronic element on a circuit board of the electronic device, wherein a material of the first heat conduction component is different from that of the first heat dissipation component, the first heat conduction component is disposed between the first heat dissipation component and the circuit board, and the first heat conduction component is located on a side, away from a substrate on the circuit board, of the at least one first electronic element;

the heat dissipation apparatus further comprises: a second heat conduction component, the second heat conduction component, relative to the first heat conduction component, is disposed on one side of the substrate away from the first heat conduction component, the circuit board further comprises at least one second electronic element disposed on the side of the substrate away from the first heat conduction component, and the second heat conduction component comprises a second heat conduction plate and at least one second heat conduction member disposed on the second heat conduction plate and corresponding to the at least one second electronic element, and the heat dissipation apparatus further comprises: a second heat dissipation component, and the first heat conduction component and the second heat conduction component are surrounded by the first heat dissipation component and the second heat dissipation component.

17. A vehicle device, comprising an electronic device, the electronic device comprising:

a circuit board comprising a substrate and at least one first electronic element disposed on one side of the substrate;

a first heat dissipation component; and a first heat conduction component comprising a first heat conduction plate and at least one first heat conduction member disposed on the first heat conduction plate and corresponding to the at least one first electronic element, wherein a material of the first heat conduction component is different from that of the first heat dissipation component, the first heat conduction component is disposed between the first heat dissipation component and the circuit board, and the first heat conduction component is located on a side, away from the substrate, of the at least one first electronic element;

the electronic device further comprises: a second heat conduction component, the second heat conduction component, relative to the first heat conduction component, is disposed on one side of the substrate away from the first heat conduction component, the circuit board further comprises at least one second electronic element disposed on the side of the substrate away from the first heat conduction component, and the second heat conduction component comprises a second heat conduction plate and at least one second heat conduction member disposed on the second heat conduction plate and corresponding to the at least one second electronic element, and the electronic device further comprises: a second heat dissipation component, and the first heat conduction component and the second heat conduction component are surrounded by the first heat dissipation component and the second heat dissipation component.

* * * * *